United States Patent
Wang

(10) Patent No.: US 9,438,179 B2
(45) Date of Patent: Sep. 6, 2016

(54) AMPLIFIER APPARATUS AND SOFT-START METHOD THEREOF

(71) Applicant: Intel Corporation, Santa Clara, CA (US)

(72) Inventor: Yu-Chung Wang, New Taipei (TW)

(73) Assignee: Intel Corporation, Santa Clara, CA (US)

( * ) Notice: Subject to any disclaimer, the term of this patent is extended or adjusted under 35 U.S.C. 154(b) by 56 days.

(21) Appl. No.: 14/449,169

(22) Filed: Aug. 1, 2014

(65) Prior Publication Data

US 2015/0244330 A1 Aug. 27, 2015

(30) Foreign Application Priority Data

Feb. 27, 2014 (CN) .......................... 2014 1 0069582

(51) Int. Cl.
*H03F 3/45* (2006.01)
*H03F 1/52* (2006.01)
*H03F 1/30* (2006.01)

(52) U.S. Cl.
CPC ................ *H03F 1/52* (2013.01); *H03F 1/305* (2013.01); *H03F 3/45183* (2013.01); *H03F 3/45* (2013.01); *H03F 2003/45008* (2013.01); *H03F 2200/426* (2013.01); *H03F 2203/45096* (2013.01); *H03F 2203/45644* (2013.01); *H03F 2203/45674* (2013.01)

(58) Field of Classification Search
CPC ........... H03F 3/45183; H03F 3/45179; H03F 3/45192; H03F 3/45188; H03F 3/45475; H03F 3/45071; H03F 3/45085; H03F 2203/45674; H03F 3/3066; H03F 1/3211

USPC .................................................. 330/252, 253
See application file for complete search history.

(56) References Cited

U.S. PATENT DOCUMENTS 8,970,302 B2* 3/2015 Schulz ................ H03F 3/45273
330/257
2005/0275462 A1* 12/2005 Heightley ........... H03F 3/45183
330/261

(Continued)

FOREIGN PATENT DOCUMENTS

CN 1719723 A 1/2006
CN 103529890 A 1/2014

OTHER PUBLICATIONS

Office Action received for Chinese Patent Application No. 201410069582.9, mailed on Mar. 25, 2016, 7 pages of Chinese Office Action.

*Primary Examiner* — Khanh V Nguyen
(74) *Attorney, Agent, or Firm* — Forefront IP Lawgroup, PLLC

(57) ABSTRACT

An amplifier apparatus includes a differential input pair, a current source, and a load. The differential input pair includes first and second transistors, and an auxiliary transistor. A control terminal of the first transistor receives a reference voltage. A first terminal of the second transistor is coupled to the first terminal of the first transistor, and a control terminal of the second transistor receives an input voltage. A first terminal of the auxiliary transistor is coupled to a first terminal of the first transistor, a second terminal of the auxiliary transistor is coupled to a second terminal of the first transistor, a control terminal of the auxiliary transistor receives a control voltage, and a base terminal thereof receives a power supply voltage. The current source and load are respectively coupled to the first terminals and second terminals of the first and second transistors.

10 Claims, 2 Drawing Sheets

(56) References Cited

U.S. PATENT DOCUMENTS

2010/0156683 A1 6/2010 Nozawa et al.
2010/0171556 A1* 7/2010 Ha .................. H03F 1/34
    330/253

* cited by examiner

AMPLIFIER APPARATUS AND SOFT-START METHOD THEREOF

CROSS-REFERENCE TO RELATED APPLICATION

This application claims the priority benefit of China application serial no. 201410069582.9, filed on Feb. 27, 2014. The entirety of the above-mentioned patent application is hereby incorporated by reference herein and made a part of this specification.

BACKGROUND OF THE INVENTION

1. Field of the Invention

The invention relates to an amplifier apparatus and particularly relates to a soft-start mechanism and a soft-start method of the amplifier apparatus.

2. Description of Related Art

In electronic apparatuses, the soft-start mechanism is an important mechanism and is often used. In the initial stage of starting up the electronic apparatus, an output voltage provided by an internal circuit needs to rise slowly from 0 volt to the required voltage value, rather than quickly jump to the required voltage value. Thus, it is required to dispose a mechanism for soft-start in the circuit.

The soft-start mechanism is mainly used to suppress an overshoot that may occur due to the rapidly increasing voltage value of the output voltage in the initial stage of starting up the electronic apparatus. The phenomenon of the excessive voltage value is often accompanied by the generation of an excessive output current. The excessive output voltage and output current may damage or even burn the circuit that receives the output voltage. The excessive output current may also cause electromagnetic interference, which affects functions of the electronic apparatus. In addition, if voltage comparison is made based on the output voltage, damping resulting from the overshoot of the output voltage may cause an erroneous comparison result and affect the overall operation of the electronic apparatus.

According to the conventional technology, a soft-start method for a differential amplifier has been proposed. Basically, the conventional method is to gradually increase the voltage value of the reference voltage that serves as the comparison reference by a digital means. Such a method can control the speed of gradual increase of the output voltage. However, since the output voltage is increased step by step gradually by the digital means, and the overshoot problem of the output voltage cannot be completely eliminated.

SUMMARY OF THE INVENTION

The invention provides an amplifier apparatus and a soft-start method thereof for effectively suppressing an overshoot of an output voltage generated therefrom.

The amplifier apparatus includes: a differential input pair, a current source, and a load. The differential input pair includes: a first transistor, a second transistor, and an auxiliary transistor. The first transistor includes a first terminal, a second terminal, and a control terminal, wherein the control terminal of the first transistor receives a reference voltage. The second transistor includes a first terminal, a second terminal, and a control terminal, wherein the first terminal of the second transistor is coupled to the first terminal of the first transistor, and the control terminal of the second transistor receives an input voltage. The auxiliary transistor includes a first terminal, a second terminal, a control terminal, and a base terminal, wherein the first terminal of the auxiliary transistor is coupled to the first terminal of the first transistor, the second terminal of the auxiliary transistor is coupled to the second terminal of the first transistor, the control terminal of the auxiliary transistor receives a control voltage, and the base terminal of the auxiliary transistor receives a power supply voltage. The current source is coupled to the first terminal of the first transistor and the first terminal of the second transistor. The load is coupled to the second terminal of the first transistor and the second terminal of the second transistor. A voltage value of the control voltage changes according to a change of a voltage value of the power supply voltage.

A soft-start method is provided for an amplifier apparatus, wherein the amplifier apparatus includes a differential input pair that has a first transistor and a second transistor. The soft-start method includes: when a power supply voltage is started up, a control voltage is generated according to a change of the power supply voltage; and an impedance is provided between a first terminal and a second terminal of the first transistor according to the control voltage and the power supply voltage, wherein an impedance value of the impedance is inversely proportional to a voltage difference between the control voltage and the power supply voltage.

Based on the above, the invention uses the auxiliary transistor to provide an impedance between the first terminal and the second terminal of the first transistor of the differential input pair when the power supply voltage is started up initially. Under the premise that the impedance changes as the power supply voltage rises, the slope of increase of the output voltage generated by the amplifier apparatus is controlled effectively to prevent various adverse effects due to excessive output voltage.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
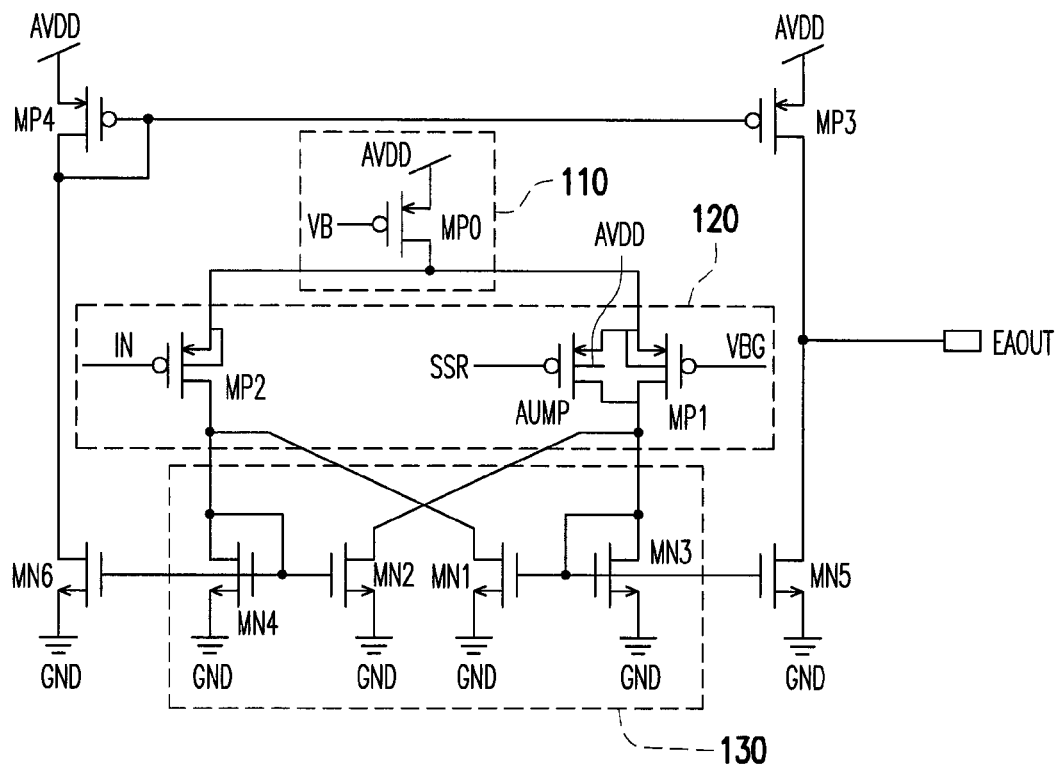
FIG. 1 is a schematic diagram of an amplifier apparatus according to an embodiment of the invention.

Referring to FIG. 1, FIG. 1 is a schematic diagram of an amplifier apparatus according to an embodiment of the invention. In FIG. 1, an amplifier apparatus 100 includes a differential input pair 120, a current source 110, and a load 130. The amplifier apparatus 100 receives a power supply voltage AVDD as an operating voltage. The differential input pair 120 includes a transistor MP1, a transistor MP2, and an auxiliary transistor AUMP. The transistors MP1 and MP2 respectively include a first terminal, a second terminal, and a control terminal, wherein the first terminal of the transistor MP1 is coupled to the first terminal of the transistor MP2, the control terminal of the transistor MP1 receives a reference voltage VBG, and the control terminal of the transistor MP2 receives an input voltage IN. In this embodiment, the amplifier apparatus 100 compares the reference voltage VBG and the input voltage IN, and amplifies a difference between the reference voltage VBG and the input voltage IN to generate an output voltage EAOUT. The reference voltage VBG may be provided by a band gap voltage generator.

The auxiliary transistor AUMP is coupled to the transistor MP1 in parallel. More specifically, the first terminal and the second terminal of the auxiliary transistor AUMP are coupled to the first terminal and the second terminal of the transistor MP1 respectively. It is emphasized that the control terminal of the auxiliary transistor AUMP receives a control voltage SSR, and a base of the auxiliary transistor AUMP receives the power supply voltage AVDD. Moreover, the control voltage SSR changes as the power supply voltage AVDD changes. Those skilled in the art should know that a voltage outputted by a circuit composed of the auxiliary transistor AUMP and the transistor MP1 is the smaller one of the SSR and VBG. That is, after the auxiliary transistor AUMP is added, the amplifier apparatus 100 amplifies the difference between the value of IN and the smaller voltage value of the SSR and VBG.

It is noted that, when the amplifier apparatus 100 is started up, the power supply voltage AVDD increases from 0 volt, and at the same time, the control voltage SSR also increases from 0 volt at a rate according to the increase of the power supply voltage AVDD. Under the condition that the auxiliary transistor AUMP is a P-type transistor, as the control voltage SSR increases, the auxiliary transistor AUMP provides an impedance that changes according to the increase of the control voltage SSR, and this impedance increases as the control voltage SSR increases. When the control voltage SSR is not higher than the reference voltage VBG, the amplifier apparatus 100 generates the output voltage EAOUT according to the difference between the input voltage IN and the control voltage SSR. However, when the control voltage SSR increases and becomes higher than the reference voltage VBG, the reference voltage VBG becomes the main reference voltage for the amplifier apparatus 100 to perform difference amplification. That is to say, at this moment, the amplifier apparatus 100 performs the difference amplification based on the input voltage IN and the reference voltage VBG to generate the output voltage EAOUT.

It is known from the above that, because the control voltage SSR may increase slowly as the power supply voltage AVDD increases, the amplifier apparatus 100 does not need to instantly amplify a large difference between the input voltage IN and the reference voltage VBG at the start-up, which may result in an overshoot of the output voltage EAOUT. On the contrary, through the process of slowly increasing the control voltage SSR by an analog means, the output voltage EAOUT is stably increased to the required voltage without causing the overshoot.

It is noted that, in this embodiment, the bases of the transistors MP1 and MP2 are jointly coupled to a joint coupling point of the first terminals of the transistors MP1 and MP2. Such a coupling method improves a power supply rejection ratio (PSRR) of the amplifier apparatus 100. The base of the auxiliary transistor AUMP receives the power supply voltage AVDD that has the higher voltage value, and through the aforementioned coupling relationship, the amplifier apparatus 100 can operate normally when the control voltage SSR is a relatively low voltage value, i.e. close to 0 volt, such that the output voltage EAOUT is generated more smoothly. And, by generating the SSR voltage with a moderate slope, the output voltage can keep up with the voltage of the software, and the output voltage is not too large or too small. The smaller an initial voltage of the SSR is, the more ideal an initial slope of the output voltage EAOUT generated by this circuit becomes, and the curve is more moderate. The invention can make the SSR close to input of 0 volt. Therefore, the output voltage EAOUT of the invention achieves a favorable soft-start effect.

Further to the above, the value of the impedance provided by the auxiliary transistor AUMP can be determined by the voltage difference between the power supply voltage AVDD and the control voltage SSR, wherein the impedance value provided by the auxiliary transistor AUMP is inversely proportional to the voltage difference between the power supply voltage AVDD and the control voltage SSR.

Moreover, the second terminals of the transistors MP1 and MP2 are respectively coupled to two end points of the load 130. In FIG. 1, the load 130 is an active load constructed by transistors MN1-MN4. The transistors MN1 and MN3 form a current mirror and are coupled between a reference ground terminal GND, the second terminal of the transistor MP1, and the second terminal of the transistor MP2. The transistors MN2 and MN4 form another current mirror and are coupled between the reference ground terminal GND, the second terminal of the transistor MP2, and the second terminal of the transistor MP1.

It is noted that the load 130 of this embodiment of the invention may also be constructed using other types of active loads or negative loads. The disclosure of FIG. 1 is merely one of the examples and should not be construed as a limitation to the invention.

The current source 110 is constructed by a transistor MP0, wherein a first terminal of the transistor MP0 receives the power supply voltage AVDD and a second terminal of the transistor MP0 is coupled to the first terminals of the transistors MP1 and MP2. A control terminal of the transistor MP0 receives a bias voltage VB to generate a current to be provided to the first terminals of the transistors MP1 and MP2.

In this embodiment, the amplifier apparatus 100 further includes an output stage circuit. In FIG. 1, the output stage circuit is constructed by transistors MP3-MP4 and MN5-MN6. The output stage circuit of the amplifier apparatus 100 is coupled to the second terminals of the transistors MP1 and MP2, and amplifies a signal according to the voltages at the second terminals of the transistors MP1 and MP2 to generate the output voltage EAOUT.

Figure 2:
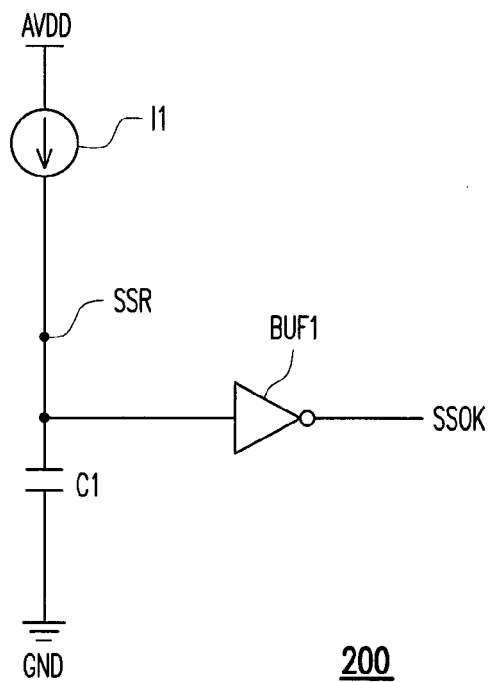
FIG. 2 is a schematic diagram of a control voltage generator according to an embodiment of the invention.

A method of generating the control voltage SSR may be implemented by means of a control voltage generator. Below, with reference to FIG. 2, FIG. 2 is a schematic diagram of the control voltage generator according to an embodiment of the invention. A control voltage generator 200 includes a current source I1, a capacitor C1, and an output buffer BUF1. The current source I1 is connected in series between the power supply voltage AVDD and the capacitor C1. An end point of the capacitor C1 is coupled to the current source I1 while the other end point is coupled to the reference ground voltage GND. The output buffer BUF1 is an inverter, wherein an input terminal of the output buffer BUF1 is coupled to a connection terminal of the capacitor C1 and the current source I1, and an output terminal of the output buffer BUF1 generates a soft-start completion signal SSOK. The connection terminal of the current source I1 and the capacitor C1 is configured to generate the control voltage SSR.

When the power supply voltage AVDD is started up, the current source I1 starts supplying a current to be injected into the capacitor C1, and the control voltage SSR at the connection point of the capacitor C1 and the current source I1 increases accordingly. An increasing slope thereof may be determined by the current supplied by the current source I1 and a capacitance value of the capacitor C1. The larger the current of the current source I1, the smaller the capacitance value of the capacitor C1 and the larger the slope of the increasing SSR.

In addition, when the voltage value of the control voltage SSR is lower than a threshold value of the output buffer BUF1, the output buffer BUF1 generates the soft-start completion signal SSOK of a high logic level to indicate that the soft-start operation is in progress. On the contrary, when the voltage value of the control voltage SSR is higher than the threshold value of the output buffer BUF1, the output buffer BUF1 generates the soft-start completion signal SSOK of a low logic level to indicate that the soft-start operation is completed.

Figure 3:
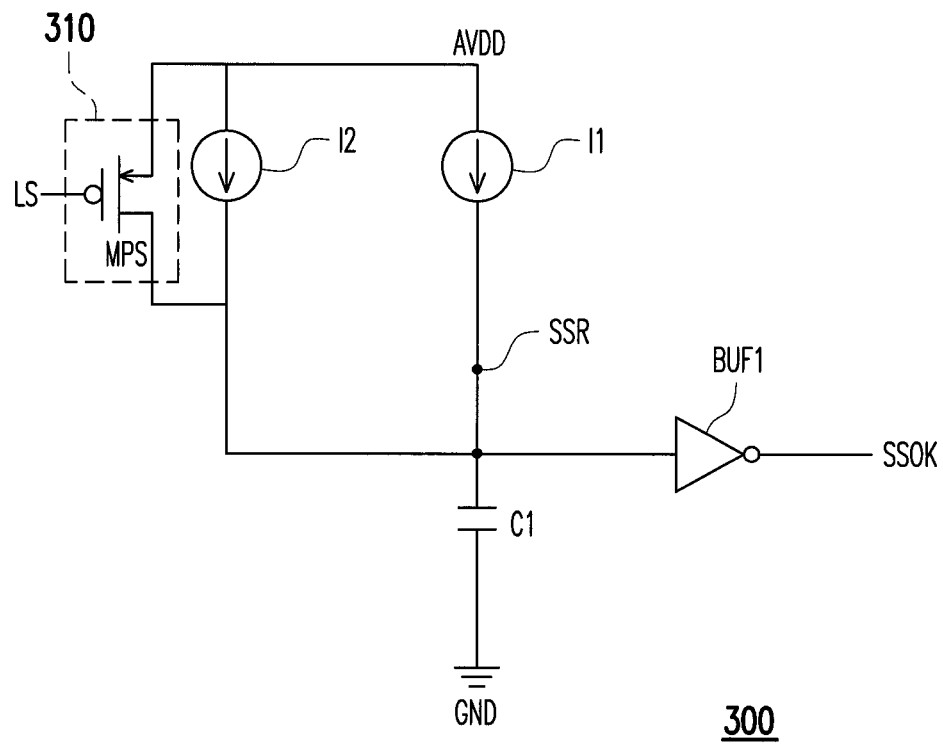
FIG. 3 is a schematic diagram of a control voltage generator according to another embodiment of the invention.

Further, with reference to FIG. 3, FIG. 3 is a schematic diagram of a control voltage generator according to another embodiment of the invention. In addition to the current source I1, the capacitor C1, and the output buffer BUF1, a control voltage generator 300 further includes a current source I2 and a switch 310. The current source I2 and the current source I1 are connected in parallel, and the switch 310 is connected in parallel to the current sources I1 and I2. The switch 310 may be constituted by a transistor MPS. A control terminal of the transistor MPS receives a signal LS that indicates a state of a load received by the output terminal of the amplifier apparatus. It is worth noticing that, when the signal LS indicates that the load received by the output terminal of the amplifier apparatus is larger than a threshold value, it indicates that the amplifier apparatus is in a heavy load state. At this moment, the switch 310 is turned on, and the control voltage SSR rapidly becomes equal to the power supply voltage AVDD to cause the amplifier apparatus to quickly generate an output voltage large enough to meet the needs of the load. On the other hand, if the signal LS indicates that the load received by the output terminal of the amplifier apparatus is not larger than the threshold value, it indicates that the amplifier apparatus is in a non-heavy load state. At this moment, the switch 310 is turned off, and the current source I2 stops charging the C1. Thus, the speed of increase of the SSR voltage slows down, and the control voltage SSR increases at a certain rate according to the current provided by the current sources I1 and I2 and a charging operation of the capacitor C1, and achieves the soft-start effect.

It is worth noticing that the state of the load received by the output terminal of the amplifier apparatus may be obtained by detecting a state of the current outputted from the output terminal of the amplifier apparatus. In the embodiments of the invention, a detection method of the load state may be obtained by applying any load detection technique commonly-known to those skilled in the art.

Figure 4:
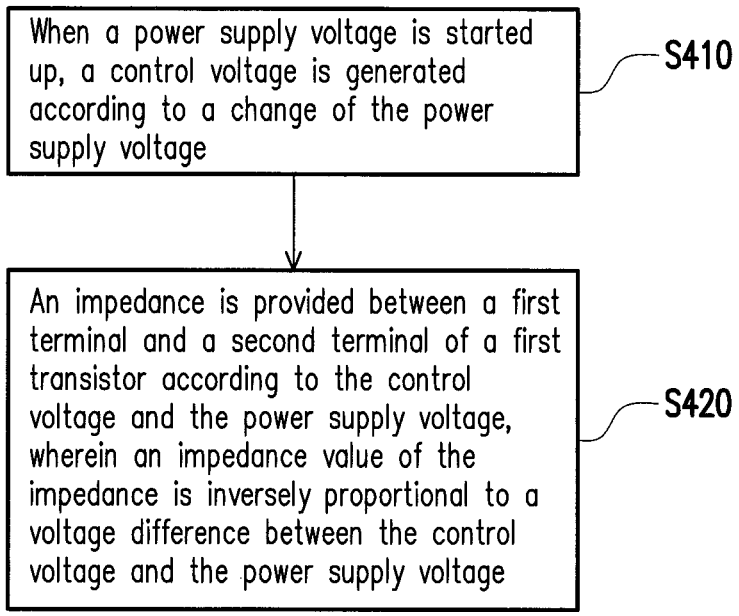
FIG. 4 is a flowchart showing a soft-start method of the amplifier apparatus according to an embodiment of the invention.

With reference to FIG. 4, FIG. 4 is a flowchart showing a soft-start method of an amplifier apparatus according to an embodiment of the invention. The amplifier apparatus includes a differential input pair that has a first transistor and a second transistor. In Step S410, when a power supply voltage that serves as an operating voltage of the amplifier apparatus is started up, a control voltage is generated according to a change of the power supply voltage. Further, in Step S420, an impedance is provided between a first terminal and a second terminal of the first transistor according to the control voltage and the power supply voltage, wherein an impedance value of the impedance is inversely proportional to a voltage difference between the control voltage and the power supply voltage.

In the above Step S420, the impedance may be provided by an auxiliary transistor connected in parallel to the first transistor, wherein a base of the auxiliary transistor receives the power supply voltage, and a control terminal of the auxiliary transistor receives the control voltage. Accordingly, the auxiliary transistor generates the impedance according to the control voltage and the power supply voltage.

Details of the above steps have been specified in the foregoing embodiments and examples of the invention and thus are not repeated hereinafter.

To conclude the above, in the invention, the auxiliary transistor is disposed to provide the impedance between the first terminal and the second terminal of the first transistor; and the amplifier apparatus first uses the gradually increasing control voltage as the reference during the starting up, and then uses the reference voltage as the reference after the soft-start is completed. Because of the analog increase of the control voltage, the amplifier apparatus effectively generates the output voltage that rises moderately to suppress the overshoot.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:
1. An amplifier apparatus, comprising:
a differential input pair, comprising:
a first transistor comprising a first terminal, a second terminal, and a control terminal, wherein the control terminal of the first transistor receives a reference voltage;
a second transistor comprising a first terminal, a second terminal, and a control terminal, wherein the first terminal of the second transistor is coupled to the first terminal of the first transistor, and the control terminal of the second transistor receives an input voltage; and
an auxiliary transistor comprising a first terminal, a second terminal, a control terminal, and a bulk/body terminal, wherein the first terminal of the auxiliary transistor is coupled to the first terminal of the first transistor, the second terminal of the auxiliary transistor is coupled to the second terminal of the first transistor, the control terminal of the auxiliary transistor receives a control voltage, and the base terminal of the auxiliary transistor receives a power supply voltage;
a current source coupled to the first terminal of the first transistor and the first terminal of the second transistor; and
a load coupled to the second terminal of the first transistor and the second terminal of the second transistor, wherein a voltage value of the control voltage changes according to a change of a voltage value of the power supply voltage.
2. The amplifier apparatus according to claim 1, further comprising:

a control voltage generator generating the control voltage and comprising:
  a first current source receiving the power supply voltage and providing a first current; and
  a capacitor comprising a terminal receiving the first current to generate the control voltage, and the other terminal of the capacitor being coupled to a reference ground terminal.

3. The amplifier apparatus according to claim 2, wherein the control voltage generator further comprises:
  a second current source receiving the power supply voltage and being coupled to the capacitor, and the second current source being configured to provide a second current to the capacitor.

4. The amplifier apparatus according to claim 3, wherein the control voltage generator further comprises:
  a switch comprising a terminal receiving the power supply voltage, and the other terminal of the switch being coupled to an end point of the capacitor which receives the first current and the second current, wherein the switch is turned on or off according to a state of a load of an output terminal of the amplifier apparatus.

5. The amplifier apparatus according to claim 4, wherein when the load of the output terminal of the amplifier apparatus is larger than a threshold value, the switch is turned on.

6. The amplifier apparatus according to claim 2, wherein the control voltage generator further comprises:
  an output buffer comprising an input terminal receiving the control voltage, and an output terminal of the output buffer generating a soft-start completion signal.

7. A soft-start method of an amplifier apparatus, which comprises a differential input pair comprising a first transistor and a second transistor, the soft-start method comprising:
  generating a control voltage according to a change of a power supply voltage when the power supply voltage is started up; and
  providing an impedance between a first terminal and a second terminal of the first transistor according to the control voltage and the power supply voltage, wherein an impedance value of the impedance is inversely proportional to a voltage difference between the control voltage and the power supply voltage.

8. The soft-start method according to claim 7, further comprising:
  providing a first current to charge a capacitor to generate the control voltage when the power supply voltage is started up.

9. The soft-start method according to claim claim 8, further comprising:
  determining whether to provide a second current to charge the capacitor to generate the control voltage according to a state of a load of an output terminal of the amplifier apparatus when the power supply voltage is started up.

10. The soft-start method according to claim 9, comprising: providing the second current to charge the capacitor to generate the control voltage when the state of the load of the output terminal of the amplifier apparatus is not larger than a threshold value; and
  stopping providing the second current to charge the capacitor to generate the control voltage when the state of the load of the output terminal of the amplifier apparatus is larger than the threshold value.

* * * * *